(12) United States Patent
Nagase et al.

(10) Patent No.: US 6,963,123 B2
(45) Date of Patent: Nov. 8, 2005

(54) IC PACKAGE, OPTICAL TRANSMITTER, AND OPTICAL RECEIVER

(75) Inventors: Toru Nagase, Tokyo (JP); Minoru Tajima, Tokyo (JP); Nobuhiro Tokumori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/427,955

(22) Filed: May 2, 2003

(65) Prior Publication Data

US 2003/0197257 A1 Oct. 23, 2003

Related U.S. Application Data

(62) Division of application No. 10/151,869, filed on May 22, 2002.

(30) Foreign Application Priority Data

Dec. 27, 2001 (JP) .............................. 2001-397936

(51) Int. Cl.[7] .............................................. H01L 21/00
(52) U.S. Cl. ...................... 257/678; 257/666; 257/619
(58) Field of Search ............................... 257/678, 619, 257/666, 782, 632, 622, 690, 691, 700, 758, 257/662, 774, 706–713

(56) References Cited

U.S. PATENT DOCUMENTS

| | | |
|---|---|---|
| 4,929,999 A | 5/1990 | Hoeberechts et al. |
| 4,953,005 A | 8/1990 | Carlson et al. |
| 5,281,151 A | 1/1994 | Arima et al. |
| 5,354,695 A * | 10/1994 | Leedy ........................ 438/411 |
| 5,360,988 A | 11/1994 | Uda et al. |
| 5,571,741 A * | 11/1996 | Leedy ........................ 438/27 |
| 5,592,007 A * | 1/1997 | Leedy ........................ 257/347 |
| 5,592,018 A * | 1/1997 | Leedy ........................ 257/619 |
| 5,633,209 A * | 5/1997 | Leedy ........................ 216/2 |
| 5,637,907 A * | 6/1997 | Leedy ........................ 257/434 |
| 5,714,252 A | 2/1998 | Hogerton et al. |
| 5,834,334 A * | 11/1998 | Leedy ........................ 438/107 |
| 5,840,593 A * | 11/1998 | Leedy ........................ 438/6 |
| 5,874,780 A | 2/1999 | Murakami |
| 5,982,018 A | 11/1999 | Wark et al. |
| 6,037,044 A | 3/2000 | Giri et al. |
| 6,165,814 A | 12/2000 | Wark et al. |
| 6,208,525 B1 | 3/2001 | Imasu et al. |
| 6,249,046 B1 * | 6/2001 | Hashimoto .................. 257/691 |
| 6,342,724 B1 | 1/2002 | Wark et al. |

(Continued)

FOREIGN PATENT DOCUMENTS

JP 10-56163 2/1998

*Primary Examiner*—Laura M Schillinger
(74) *Attorney, Agent, or Firm*—Buchanan Ingersoll PC

(57) ABSTRACT

There is provided an IC package provided with one or more bare chips mounted on a chip carrier, a plurality of first bumps each for connecting a chip electrode to a conductive pad disposed on an upper surface of the chip carrier, a plurality of second bumps each connected to a conductive pad disposed on a bottom surface of the chip carrier, and a plurality of vias for connecting between conductive pads disposed on the upper and bottom surfaces of the chip carrier. A differential pair of lines are exposed on the upper surface of the chip carrier. High-frequency signals to be processed by the one or more bare chips are transmitted by way of the differential pair of lines, and other signals are transmitted by way of the plurality of second bumps.

20 Claims, 11 Drawing Sheets

U.S. PATENT DOCUMENTS

| | | |
|---|---|---|
| 6,461,896 B1 | 10/2002 | Imasu et al. |
| 6,467,972 B2 * | 10/2002 | Setoguchi .................... 385/88 |
| 6,613,597 B2 * | 9/2003 | Stack .......................... 438/27 |
| 6,664,874 B2 * | 12/2003 | Shirasaki .................... 333/247 |
| 6,713,376 B2 * | 3/2004 | Sugihara .................... 438/613 |
| 6,717,255 B2 * | 4/2004 | Oggioni et al. ............. 257/690 |
| 6,721,511 B1 * | 4/2004 | Tatsuno et al. ............. 398/141 |
| 2002/0131727 A1 * | 9/2002 | Reedy et al. ................. 385/88 |
| 2003/0122228 A1 * | 7/2003 | Nagase et al. ............. 257/678 |
| 2003/0197257 A1 * | 10/2003 | Nagase et al. ............. 257/678 |
| 2003/0218238 A1 * | 11/2003 | Kikuchi et al. ............. 257/678 |
| 2003/0231088 A1 * | 12/2003 | Kikuchi et al. ............. 333/247 |

* cited by examiner

FOR TRANSMISSION OF DATA
FOR TRANSMISSION OF CLOCK

IC PACKAGE, OPTICAL TRANSMITTER, AND OPTICAL RECEIVER

This application is a divisional of U.S. Application Ser. No. 10/151,869, filed on May 22, 2002.

BACKGROUND OF THE INVENTION

1. Field of the Invention

The present invention relates to an IC package having a lot of pins, and an optical receiver and an optical transmitter each of which employs the IC package.

2. Description of the Prior Art

Referring now to FIGS. 13A to 13C, there is illustrated a prior art IC package having a lot of pins and including such a circuit as a multiplexer (MUX) for use in an optical transmitter or a demultiplexer (DEMUX) for use in an optical receiver. FIG. 13A is a top plan view of the IC package, FIG. 13B is a side view of the IC package, and FIG. 13C is a bottom plan view of the IC package.

In FIGS. 13A to 13C, reference numeral 1 denotes a chip carrier constructed of low temperature cofired ceramic in which a plurality of dielectric substances each of which includes conductive pads, vias (or connection holes), conductive lines, and grounded conductors are laminated. For example, the chip carrier 1 has a 10 mm to 20 mm square. Reference numeral 2 denotes a group of one or more bare chips mounted on an upper surface of the chip carrier 1, the group having a function of serving as MUX or DEMUX in the unit of the group of one or more bare chips and each bare chip having a 1 mm to 5 mm square, reference numeral 3 denotes a metallic lid for covering the group of one or more bare chips 2 and so on, and reference numeral 14 denotes a bump (projecting electrode) with a size of about 0.5 mm, which constitutes a ball grid array (BGA), a plurality of bumps 14 being disposed on a lower surface of the chip carrier 1. In general, a plurality of bare chips 2 are mounted on the chip carrier 1.

FIG. 14 is a side view showing the structure of either an optical transmitter or an optical receiver which employs the IC package shown in FIGS. 13A to 13C. In FIG. 14, reference numeral 4 denotes a circuit board made of a resin and equipped with the IC package 20 consisting of the chip carrier 1, the plurality of bare chips 2, the metallic lid 3, and the plurality of bumps 14, reference numeral 30 denotes an optical module that performs electric-to-light conversion or light-to-electric conversion, reference numeral 32 denotes a feedthrough disposed in the optical module 30, through which high-frequency signals are transmitted, and reference numeral 45 denotes leads for connecting a differential pair of lines disposed on the circuit board 4, through which high-frequency signals are transmitted, to a differential pair of lines formed in the feedthrough 32.

In the case of the optical transmitter, the IC package 20 shown in FIG. 14 has the group of bare chips 2 having a function of MUX, and the optical module 30 can be either an LD (laser diode) module provided with a laser diode for generating an optical signal from an electrical signal or an EA module provided with an EA element (electro-absorption modulator) for generating modulated light from incoming light of certain intensity. In contrast, in the case of the optical receiver, the IC package 20 has the group of bare chips 2 having a function of DEMUX, and the optical module 30 can be a PD (photo diode) module provided with a photo diode for generating an electrical signal from an optical signal.

MUX used for optical transmitters and DEMUX used for optical receivers are high-performance ICs, and each of them consists of high-density MMICs (monolithic microwave integrated circuits). MUX has a signal multiplexing function and converts a 16-channel parallel data signal of 2.5 Gbps which is a low-speed parallel data signal from a logic LSI on a system's side into a 1-channel serial data signal of 40 Gbps which is a high-speed serial data signal. MUX then outputs the serial data signal to a laser diode or an EA element in the optical module 30 by way of the feedthrough 32.

DEMUX has a signal demultiplexing function and converts a 1-channel serial data signal of 40 Gbps which is a high-speed serial data signal and which is input from a photo diode or the like in the optical module 30 by way of the feedthrough 32 into a 16-channel parallel data signal of 2.5 Gbps which is a low-speed parallel data signal. DEMUX then outputs to the 16-channel parallel data signal to a logic LSI on a system's side.

Thus MUX and DEMUX are high-performance ICs with a lot of pins. Accordingly, QFP (quad flat package) or BGA (ball grid array) is generally adopted as the structure of an IC package housing such a high-performance IC. BGA is preferable to achieve a higher density.

However, when such an IC package structure is adopted, it is difficult to transmit a wide-band signal including high-frequency components such as microwaves or miliwaves over a wide frequency band from DC level to several tens of GHz with slight deterioration of the transmission characteristics of high-frequency signals. Such a transmission technology indispensable to implement 40 Gb/s optical transmitters and 40 Gb/s optical receivers has not been established. For example, when connecting the IC package 20 having a 10 mm to 20 mm square to the circuit board 4 by using BGA, each bump 14 has to have a size of about 0.5 mm in order to ensure that each bump 14 disposed on the lower surface of the IC package 20 is secured to the circuit board 4 by soldering.

However, with the current state of the art, when the IC package 20 is secured to the circuit board 4 by using the plurality of bumps 14 each having such a size, only high-frequency signals of about 20 Gbps or less (microwave band) can be input and output to and from the IC package 20. This is because the change in the characteristic impedance according to a stray capacitance between the plurality of bumps 14 and grounded conductors increases as the frequency rises, and the transmission characteristics of high-frequency signals are therefore deteriorated.

Furthermore, as shown in FIG. 14, in the conventional example of implementation of BGA, the differential pair of lines disposed in the feedthrough 32 of the optical module 30 are electrically coupled to the differential pair of lines extending to an end portion of the upper surface of the circuit board 4 by way of the leads 45 so that the circuit board 4 and the optical module 30 are electrically connected to each other. The junction between the differential pair of lines in the optical module 30 and the differential pair of lines on the circuit board 4 thus has a discontinuous point at high frequencies, and further transmission characteristic deterioration caused by this discontinuous point is not avoided. Furthermore, since the transmission path for high frequencies becomes long by the connection length L1 of the leads 45 and the line length L2 from the junction to the BGA and the transmission loss increases with the increase in the length of the transmission path, the transmission characteristics of high-frequency signals is further deteriorated.

On the other hand, as a general technique for transmitting high-frequency signals in the IC package 20, a feedthrough structure using a thick ceramic circuit board or the like is often used. When all interfaces of the IC package 20 having a lot of pins, such as MUX or DEMUX, are constructed of feedthroughs, thick ceramic circuit boards are arranged on lateral surfaces of the IC package 20 so that they are projecting in a horizontal direction from the lateral surfaces, and a plurality of leads, which penetrate the IC package 20, are arranged on each thick ceramic circuit board. Therefore, the IC package 20 increases in size and wire bonding or ribbon bonding is needed for the connection between the plurality of leads and an external circuit, thereby deteriorating the manufacturability.

In sum, the first problem with the prior art IC package 20 constructed as mentioned above is that when all input/output terminals of the IC package 20 with a lot of pins, such as MUX and DEMUX, are constructed of BGA and high-frequency signals are transmitted on the circuit board 4, the deterioration of the transmission characteristics of high-frequency signals increases according to the change in the characteristic impedance between each bump 14 and the grounded conductors, the discontinuous point at high frequencies in the junction between the circuit board 4 and the optical module 30, and the transmission loss caused in the transmission path between the IC package 20 and the optical module 30.

Furthermore, the second problem with the prior art IC package 20 is that when all input/output terminals of the IC package 20 with a lot of pins, such as MUX and DEMUX, are constructed of feedthroughs which provide slight deterioration of the transmission characteristics of high-frequency signals, the IC package 20 increases in size and a plurality of leads or the like are needed for the connection with an external circuit, thereby deteriorating the manufacturability.

SUMMARY OF THE INVENTION

The present invention is proposed to solve the above-mentioned problems, and it is therefore an object of the present invention to provide an IC package which provides slight deterioration of the transmission characteristics of high-frequency signals, and which offers good manufacturability while permitting downsizing of the IC package, and an optical transmitter and an optical receiver which employ the IC package.

In accordance with an aspect of the present invention, there is provided an IC package including: a chip carrier; a bare chip mounted on a first surface of the chip carrier; a plurality of first bumps for connecting a plurality of chip electrodes disposed on the bare chip to a plurality of first conductive pads disposed on the first surface of the chip carrier, respectively, the plurality of first conductive pads being classified into first and second groups; a plurality of vias for connecting a plurality of second conductive pads disposed on a second surface of the chip carrier opposite to the first surface to the first conductive pads of the first group, respectively; a plurality of second bumps connected to the second conductive pads, respectively; and at least a conductive line formed with the chip carrier and connected to one of the first conductive pads of the second group, high-frequency signals processed by the bare chip being transmitted by way of the conductive line, and signals other than the high-frequency signals being transmitted by way of the plurality of second bumps.

In accordance with another aspect of the present invention, the IC package further includes a metallic lid for covering the first surface of the chip carrier with the conductive line being exposed.

In accordance with a further aspect of the present invention, the IC package further includes a groove formed in the first surface of the chip carrier, the conductive line being exposed in the groove.

In accordance with another aspect of the present invention, the IC package further includes a groove formed in the second surface of the chip carrier, the conductive line being exposed in the groove.

In accordance with a further aspect of the present invention, the IC package further includes a wall surrounding the groove and projecting from the second surface of the chip carrier.

In accordance with another aspect of the present invention, the bare chip has a signaling multiplexing function of multiplexing low-speed parallel signals into a high-speed serial signal.

In accordance with a further aspect of the present invention, the bare chip has a signaling demultiplexing function of demultiplexing a high-speed serial signal into low-speed parallel signals.

In accordance with another aspect of the present invention, there is provided an optical transmitter including: an IC package including a chip carrier, a bare chip mounted on a first surface of the chip carrier, a plurality of first bumps for connecting a plurality of chip electrodes disposed on the bare chip to a plurality of first conductive pads disposed on the first surface of the chip carrier, respectively, the plurality of first conductive pads being classified into first and second groups, a plurality of vias for connecting a plurality of second conductive pads disposed on a second surface of the chip carrier opposite to the first surface to the first conductive pads of the first group, respectively, a plurality of second bumps connected to the second conductive pads, respectively, and at least a conductive line formed with the chip carrier and connected to one of the first conductive pads of the second group; an optical module having a feedthrough in which a conductive line through which a high-frequency signal is transmitted is formed, for transmitting an optical signal; and a first circuit board to which the IC package is secured by way of the plurality of second bumps of the IC package, a high-frequency signal from the bare chip of the IC package to the optical module being transmitted by way of the conductive line formed with the chip carrier and the conductive line formed in the feedthrough, and signals other than the high-frequency signal being input into the bare chip of the IC package by way of the plurality of second bumps.

In accordance with a further aspect of the present invention, the conductive line exposed on the surface of the chip carrier is connected to the conductive line formed in the feedthrough by wire bonding or ribbon bonding.

In accordance with another aspect of the present invention, the conductive line exposed on the surface of the chip carrier is connected to the conductive line formed in the feedthrough by way of a second circuit board on which a conductor line is formed.

In accordance with a further aspect of the present invention, the conductive line exposed on the surface of the chip carrier is connected to the conductive line formed in the feedthrough by way of a flexible circuit board on which a conductor line is formed.

In accordance with another aspect of the present invention, the conductive line exposed on the surface of the chip carrier and the conductive line formed in the feedthrough are arranged in the same plane.

In accordance with a further aspect of the present invention, there is provided an optical receiver including: an IC package including a chip carrier, a bare chip mounted on a first surface of the chip carrier, a plurality of first bumps for connecting a plurality of chip electrodes disposed on the bare chip to a plurality of first conductive pads disposed on the first surface of the chip carrier, respectively, the plurality of first conductive pads being classified into first and second groups, a plurality of vias for connecting a plurality of second conductive pads disposed on a second surface of the chip carrier opposite to the first surface to the first conductive pads of the first group, respectively, a plurality of second bumps connected to the second conductive pads, respectively, and at least a conductive line formed with the chip carrier and connected to one of the first conductive pads of the second group; an optical module having a feedthrough in which a conductive line through which a high-frequency signal is transmitted is formed, for receiving an optical signal; and a first circuit board to which the IC package is secured by way of the plurality of second bumps of the IC package, a high-frequency signal from the optical module to the bare chip of the IC package being transmitted by way of the conductive line formed in the feedthrough and the conductive line formed with the chip carrier, and signals other than the high-frequency signal output from the bare chip of the IC package being transmitted by way of the first circuit board and the plurality of second bumps.

In accordance with another aspect of the present invention, the conductive line exposed on the surface of the chip carrier is connected to the conductive line formed in the feedthrough by wire bonding or ribbon bonding.

In accordance with a further aspect of the present invention, the conductive line exposed on the surface of the chip carrier is connected to the conductive line formed in the feedthrough by way of a second circuit board on which a conductor line is formed.

In accordance with another aspect of the present invention, the conductive line exposed on the surface of the chip carrier is connected to the conductive line formed in the feedthrough by way of a flexible circuit board on which a conductor line is formed.

In accordance with a further aspect of the present invention, the conductive line exposed on the surface of the chip carrier and the conductive line formed in the feedthrough are arranged in the same plane.

Accordingly, in accordance with the present invention, the deterioration of the transmission characteristics of high-frequency signals can be reduced, and the IC package can be downsized. Furthermore, the manufacturability of the IC package can be improved by enabling the mounting of the IC package on the circuit board by reflow soldering.

Further objects and advantages of the present invention will be apparent from the following description of the preferred embodiments of the invention as illustrated in the accompanying drawings.

DETAILED DESCRIPTION OF THE PREFERRED EMBODIMENTS

Hereafter, the preferred embodiments of the present invention will be explained.

Embodiment 1.

Figure 1A:
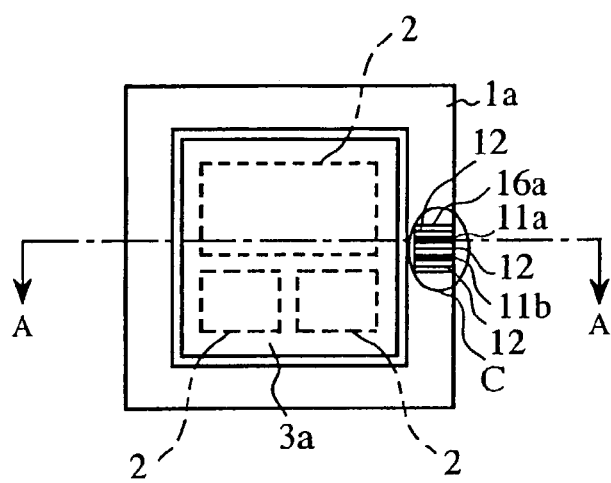
FIGS. 1A to 1E are views showing the structure of an IC package according to a first embodiment of the present invention.
Figure 1C:
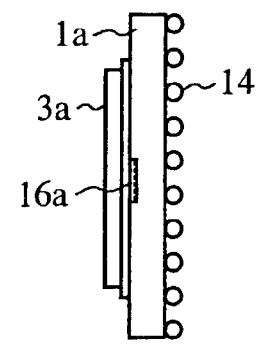
Figure 1B:
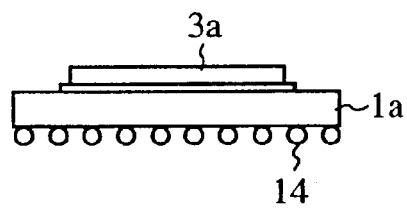
Figure 1E:
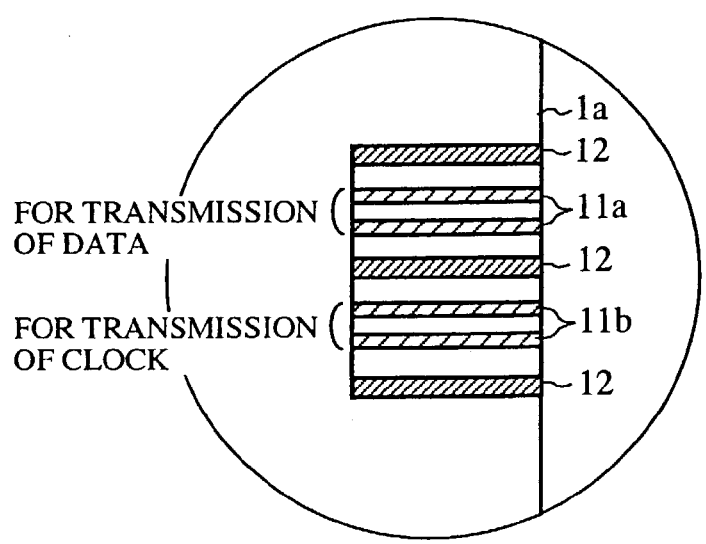
Figure 1D:
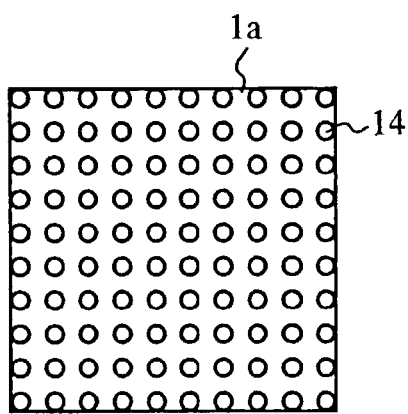
Figure 13A:
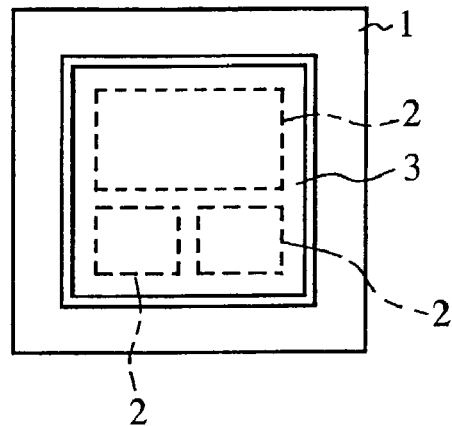
FIGS. 13A to 13C are views showing the structure of a prior art IC package.
Figure 13B:
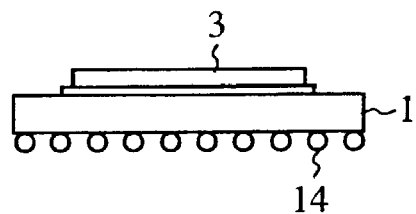
Figure 13C:
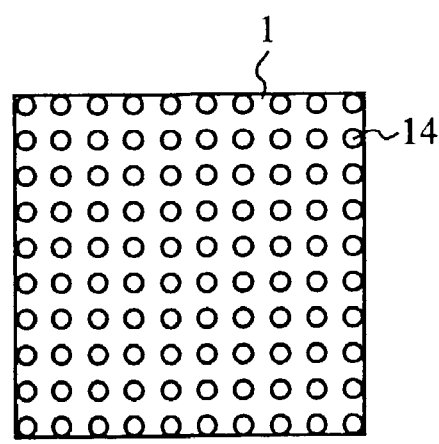

Referring now to FIGS. 1A to 1E, there is illustrated an IC package according to a first embodiment of the present invention. FIG. 1A is a top plan view of the IC package, FIGS. 1B and 1C are side views of the IC package, FIG. 1D is a bottom plan view of the IC package, and FIG. 1E is a partially enlarged detail view of a circle C of FIG. 1A including an exposed portion of two differential pairs of lines of the IC package. In FIGS. 1A to 1E, a group of one or more bare chips and a plurality of bumps are the same as those shown in FIG. 13 of the prior art IC package, and these components are designated by the same reference numerals and therefore the explanation of the components will be omitted hereafter.

Furthermore, in FIGS. 1A to 1E, reference numeral 1a denotes a chip carrier, reference numeral 3a denotes a metallic lid, reference numerals 11a and 11b denote the two differential pairs of lines (conductive lines) each of which is disposed on an upper surface (first surface) of the chip carrier 1a, a high-frequency signal being transmitted via each of the differential pairs of lines 11a and 11b, reference numeral 12 denotes a grounded conductor, and reference numeral 16a denotes a groove formed in an end portion of the upper surface of the chip carrier 1a, both ends of each of the differential pairs of lines 11a and 11b being exposed in the groove 16a. The differential pair of lines 11a shown in FIG. 1E are used for transmission of a data signal, and the other differential pair of lines 11b are used for transmission of a clock signal. As an alternative, the differential pair of lines 11a can be used for transmission of a clock signal, and the other differential pair of lines 11b can be used for transmission of a data signal.

Figure 2:
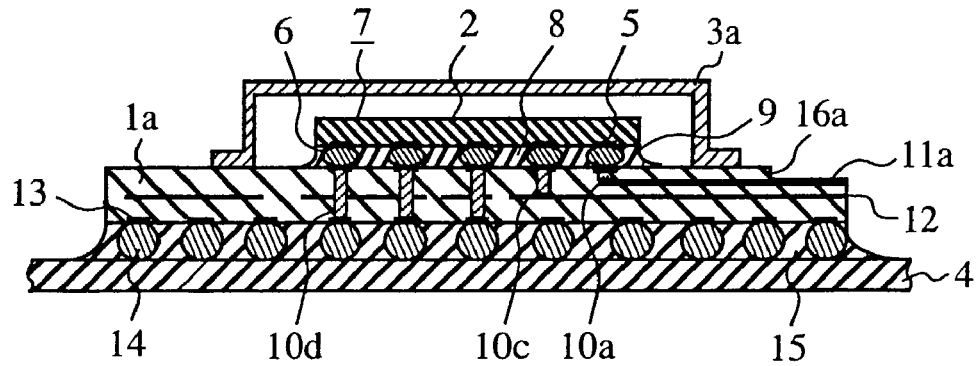
FIG. 2 is a cross-sectional view of the IC package according to first embodiment of the present invention taken along the line A—A of FIG. 1A.

FIG. 2 is a cross-sectional view of the IC package taken along the line A—A of FIG. 1A. In FIG. 2, the chip carrier 1a, the plurality of bare chips 2, the metallic lid 3a, a differential pairs of lines 11a and 11b, the plurality of bumps 14, and the groove 16a of FIGS. 1A to 1E are also illustrated. Reference numeral 4 denotes a circuit board made of a resin, on which the IC package is mounted, reference numeral 5 denotes a chip electrode disposed on a lower surface of each bare chip 2, reference numeral 6 denotes a bump (first bump) shaped like a sphere or a barrel, each bump having a size of about 100 micrometers to 200 micrometers, and reference numeral 7 denotes a chip including the plurality of bare chips 2 and a plurality of bumps 6.

Furthermore, in FIG. 2, reference numeral 8 denotes an underfill formed by filling a resin under the plurality of bare chips 2, reference numeral 9 denotes a conductive pad (first conductive pad) disposed on the upper surface of the chip carrier 1a, reference characters 10a, 10c and 10d denote vias formed in the chip carrier 1a, reference numeral 12 denotes a grounded conductor which is a ground, reference numeral 13 denotes a conductive pad (second conductive pad) disposed on a lower surface (second surface) of the chip carrier 1a, and reference numeral 15 denotes an underfill formed by filling an electrical insulating resin under the chip carrier 1a. As shown in FIG. 2, some of the plurality of conductive pads 9 are connected to a corresponding plurality of conductive pads 13 by way of the vias 10d, respectively, some of the remainder are connected to the differential pairs of lines 11a and 11b by way of the via 10a and another via not shown, respectively, and the remaining one or more conductive pads 9 are connected to the grounded conductor 12 by way of the vias 10c.

The plurality of bumps 6 disposed under the chip electrodes 5 are secured to the plurality of conductive pads 9, respectively, with thermocompression bonding, solder, a conductive adhesive, or the like so that the chip 7 is secured to the plurality of conductive pads 9. The plurality of conductive pads 9 are connected to a conductor pattern formed in the chip carrier 1a, the plurality of vias 10a, 10c and 10d and other vias (not shown) so that various signals are transmitted inside the chip carrier 1a by way of the conductor pattern, the plurality of vias 10a, 10c and 10d and the other vias (not shown).

Furthermore, the plurality of bumps (second bumps) 14 connected to the plurality of conductive pads 13 disposed under the chip carrier 1a are secured to a plurality of conductive pads (not shown) disposed on the circuit board 4 with reflow solder, respectively, so that various signals are transmitted in the circuit board 4 by way of the vias 10d connected to the plurality of conductive pads (not shown), or a conductor pattern disposed on a surface of the circuit board 4 or in the circuit board. In addition, the differential pairs of lines 11a and 11b of the chip carrier 1a, and the grounded conductor 12 are connected to some chip electrodes 5 of the bare chip 2 by way of the vias 10a, 10b and 10c.

As shown in FIGS. 1A to 1E and 2, the groove 16a shaped like a rectangular solid is formed in an upper end portion of the chip carrier 1a, and ends of each of the differential pair of lines 11a and 11b are exposed on a bottom surface of the groove 16a. The differential pairs of lines 11a and 11b, and some grounded conductors 12 constitute a unit for transmission of high-frequency signals. As shown in FIG. 1E, each of the differential pairs of lines 11a and 11b consists of two lines formed on the bottom surface of the groove 16a disposed in the upper surface of the chip carrier 1a, and three grounded conductors 12 are arranged between the two differential pairs of lines 11a and 11b, and on both outer sides of them, respectively.

The metallic lid 3a is secured on the chip carrier 1a by bonding, resistance-welding, or the like so as to enclose the plurality of bare chips 2 and conductive layers formed on the upper surface of the chip carrier 1a therein. The metallic lid 3a can prevent moisture and dust from entering into each bare chip 2 and also can provide electromagnetic shielding for each bare chip 2 and the conductive layers formed on the upper surface of the chip carrier 1a. Thus, the chip carrier 1a on which the plurality of bare chips 2 are mounted, the metallic lid 3a, and the plurality of bumps 14 constitute the IC package. The metallic lid 3a can be omitted when the gap between each bare chip 2 and the chip carrier 1a is filled with underfill. In this case, the upper surface of each bare chip 2 can be coated with a resin, adhesive or thermal grease. As a result, each bare chip 2 can be thermally coupled to a heat sink such as a lid for covering the IC package. In a case where some bare chips can have electric elements exposed on an upper surface thereof, a resin or thermal grease coated on the upper surface of each bare chip can provide hermetic sealing for electric elements exposed on the upper surface, can prevent moisture from entering into electric elements, and can enable thermal conduction from electric elements to the lid.

Figure 3A:
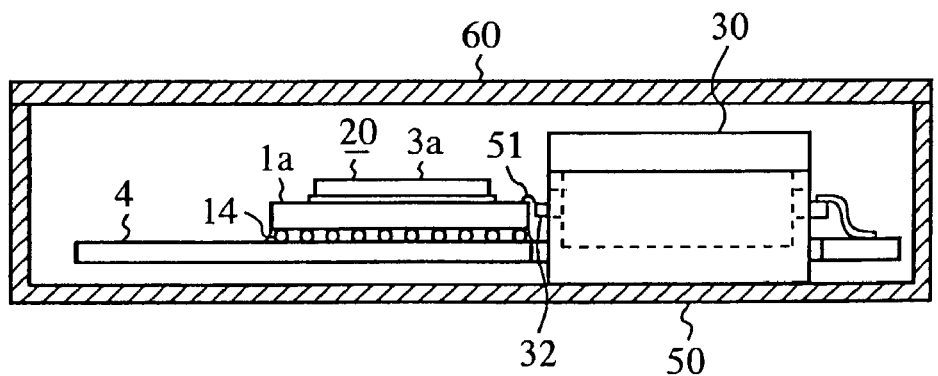
FIGS. 3A and 3B are views showing the structure of an optical transmitter which employs the IC package according to the first embodiment of the present invention.
Figure 3B:
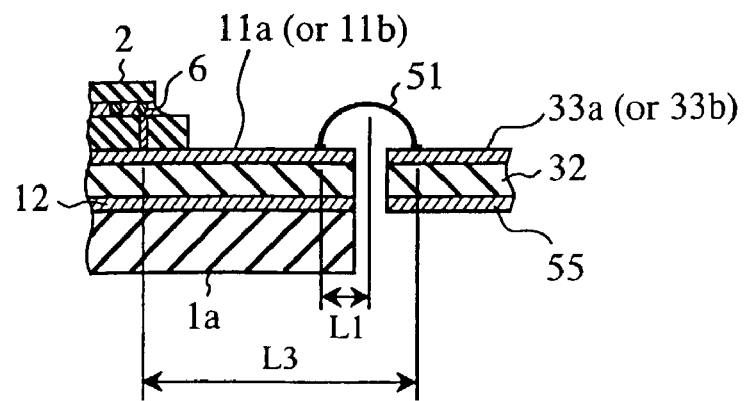

FIGS. 3A and 3B are views showing the structure of an optical transmitter which employs the IC package shown in FIGS. 1A to 1E and 2. As shown in FIG. 3A, the IC package 20 consisting of the chip carrier 1a, the plurality of bare chips 2, the metallic lid 3a, and the plurality of bumps 14 is mounted on the circuit board 4. Furthermore, in FIG. 3A, reference numeral 30 denotes an optical module. In the optical transmitter, an EA module provided with an EA element for generating modulated light is used as the optical module. Reference numeral 32 denotes a feedthrough disposed in the optical module 30 through which a high-frequency signal is transmitted and which consists of a thick ceramic circuit board or the like, reference numeral 50 denotes a housing of the optical transmitter, and reference numeral 60 denotes a cover of the optical transmitter.

Figure 14:
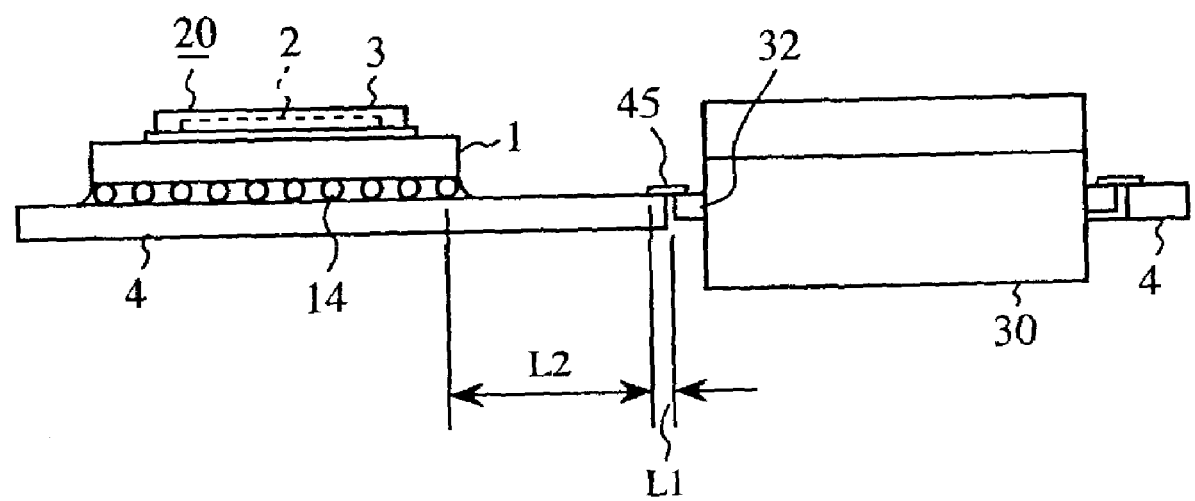
FIG. 14 is a side view showing the structure of an optical transmitter or receiver which employs the prior art IC package of FIGS. 13A to 13C.

FIG. 3B is a partially enlarged cross-sectional view of the two differential pairs of lines 11a and 11b of the chip carrier 1a and the feedthrough 32 of the optical module 30. In FIG. 3B, reference numeral 51 denotes gold wires for connecting the differential pairs of lines 11a and 11b to differential pairs of lines formed in the feedthrough 32 by bonding, and reference numeral 55 denotes a grounded conductor formed in the feedthrough 32. Instead of the gold wires 51, gold ribbons for connecting the differential pairs of lines 11a and 11b to the differential pairs of lines formed in the feedthrough 32 by bonding can be used. Since the plurality of gold wires 51 are used for connecting the differential pairs of lines 11a and 11b to the differential pairs of lines formed in the feedthrough 32 by bonding, L1 shown in FIG. 3B can be shortened as much as possible, as compared with the prior art case of using leads 45 shown in FIG. 14, and the deterioration of the transmission characteristics of high-frequency signals at the discontinuous point can be reduced.

Figure 4:
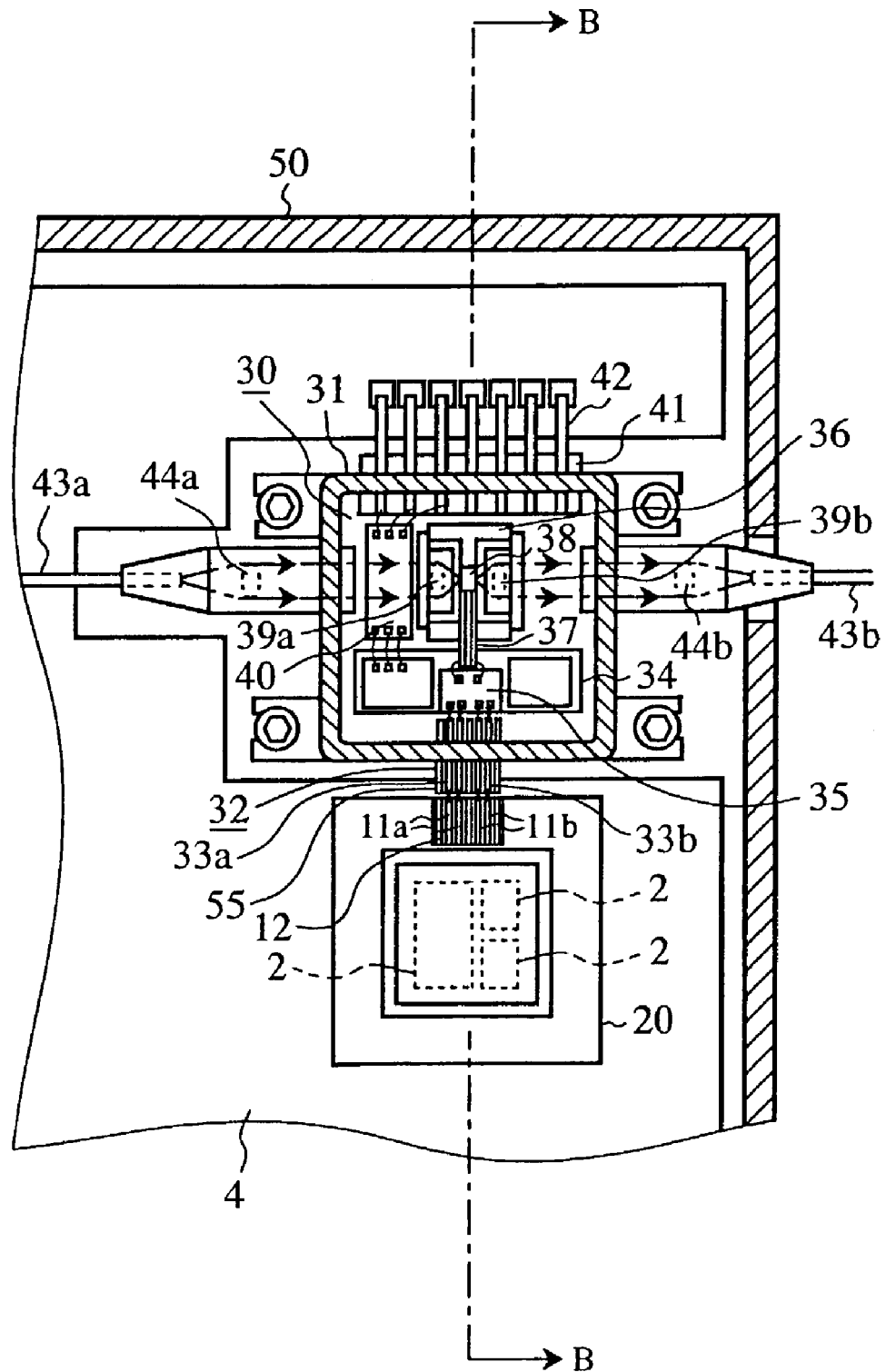
FIG. 4 is a partially sectional view showing the internal structure of the optical transmitter according to the first embodiment of the present invention.
Figure 5:
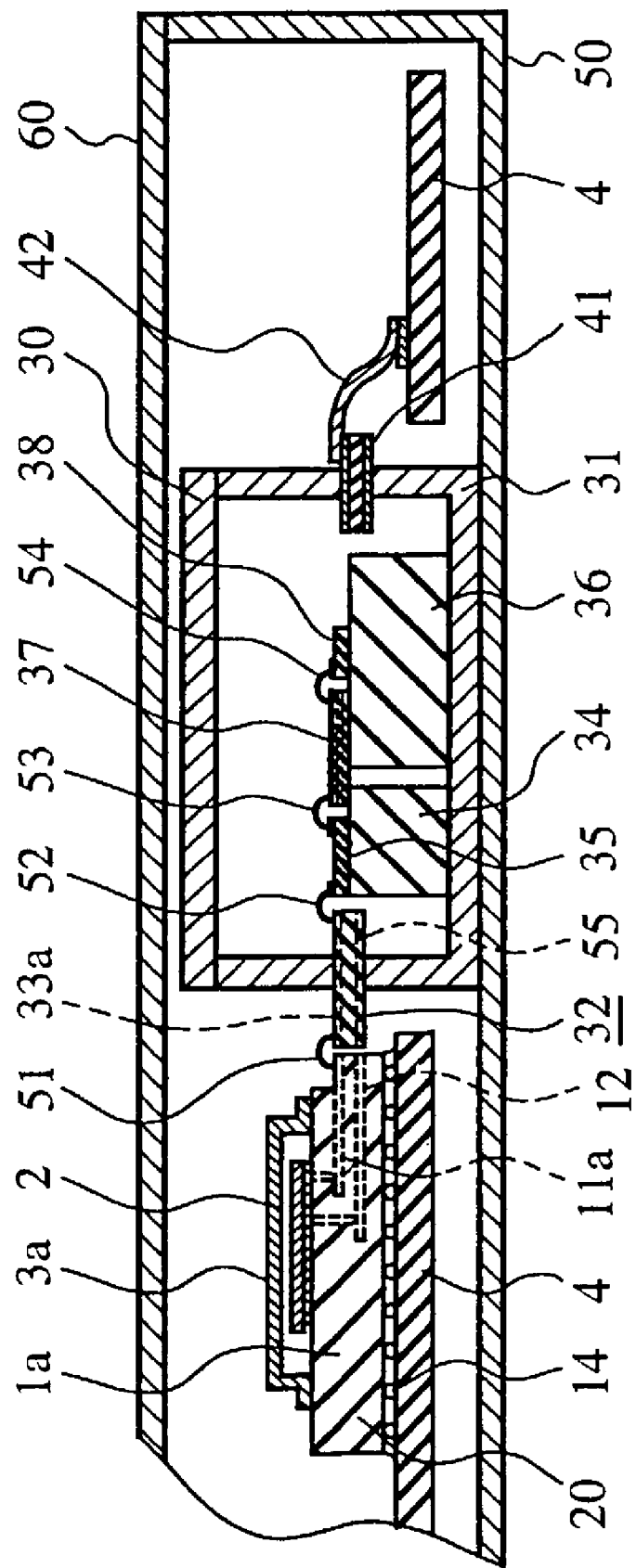
FIG. 5 is a sectional side elevation showing the internal structure of the optical transmitter according to the first embodiment of the present invention.

FIG. 4 is a partially cross-sectional view showing the internal structure of the optical transmitter, and FIG. 5 is a partially sectional side elevation showing the internal structure of the optical transmitter taken along the line B—B of FIG. 4. As shown in FIG. 4, the circuit board 4 is accommodated in the housing 50 of the optical transmitter and the IC package 20 is mounted on the circuit board 4. Furthermore, the optical module 30 (an EA module in this case) is secured in the housing 50 so that it is housed in a cutaway portion formed in the circuit board 4.

The feedthrough 32 in which the two differential pairs of lines (conductive lines) 33a and 33b through which high-frequency signal are transmitted, a circuit board 34 equipped with a driver 35, a metallic mount 36, a circuit board 37, an optical semiconductor element 38, lenses 39a and 39b, a circuit board 40, and a feedthrough 41 are accommodated in a package 31 of the optical module 30. The optical semiconductor element 38 consists of an EA element (electro-absorption modulator), and is mounted on the metallic mount 36. Furthermore, the lenses 39a and 39b are secured to the metallic mount 36, and optical fibers 43a and 43b are coupled to the optical module 30.

The two differential pairs of lines 11a and 11b of the IC package 20 are connected to the two differential pairs of lines 33a and 33b disposed in the feedthrough 32 by way of the gold wires 51 shown in FIG. 5, respectively. Each of the two differential pairs of lines 33a and 33b also consist of two lines, like each of the two differential pairs of lines 11a and 11b shown in FIG. 1E. Three grounded conductors are arranged between the two differential pairs of lines 33a and 33b, and on both outer sides of the differential pairs of lines 33a and 33b. The two differential pairs of lines 33a and 33b disposed in the feedthrough 32 are connected to corresponding pads (high-frequency signal input terminals) disposed on an upper surface of the driver 35 by way of gold wires 52 shown in FIG. 5 so that a high-frequency signal from the IC package 20 is input to the driver 35.

A control signal for controlling the driver 35 and various bias signals transmitted from conductive terminals on the circuit board 4 to the interior of the optical module 30 by way of leads 42 disposed in the feedthrough 41 are transmitted to the driver 35 mounted on the circuit board 34 by way of wiring between the feedthrough 41 and the circuit board 40, and by way of wiring between the circuit boards 40 and 34, as shown in FIG. 4. Output terminals for high-frequency signals of the driver 35 are connected to high-frequency transmission lines disposed on the circuit board 37 by way of gold wires 53 shown in FIG. 5. The high-frequency transmission lines are connected to the optical semiconductor element 38 by way of gold wires 54 shown in FIG. 5. Instead of connecting plural lines disposed in the feedthrough 41, which are connected to corresponding leads 42, to the driver 35 by way of the circuit board 40, the corresponding leads 42 can be disposed on a lateral surface of the package 31 on a side of the optical fiber 43a and plural lines disposed in a feedthrough connected to the corresponding leads 42 can be directly connected to the driver 35.

Figure 6A:
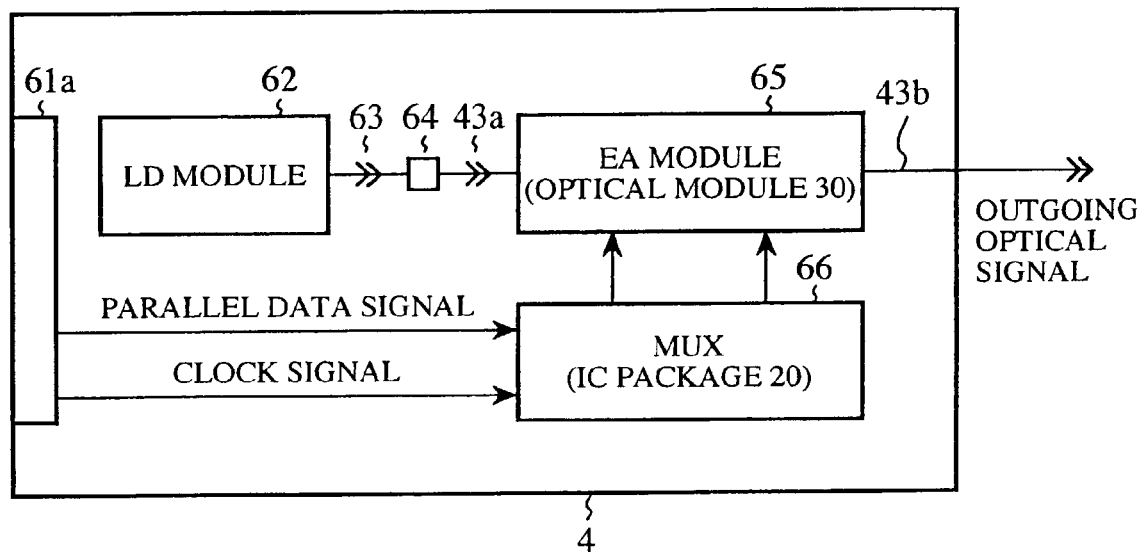
FIG. 6A is a block diagram showing the structure of the optical transmitter according to the first embodiment of the present invention.
Figure 6B:
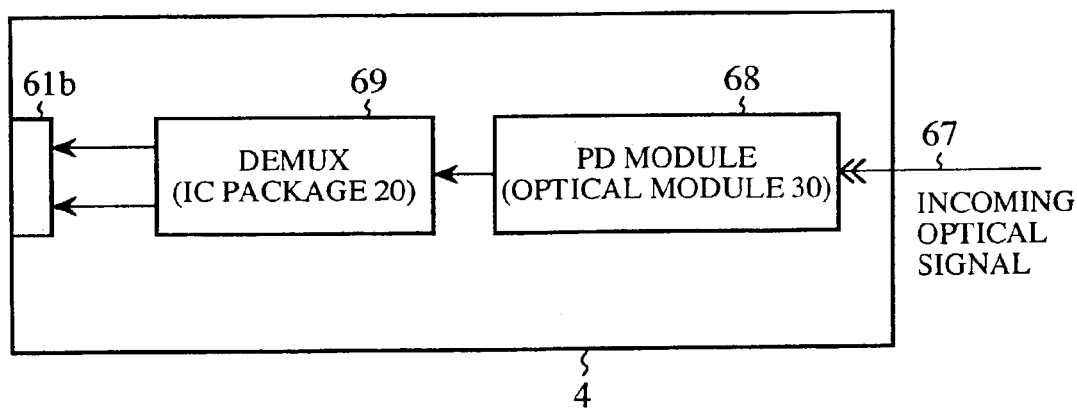
FIG. 6B is a block diagram showing the structure of an optical receiver according to the first embodiment of the present invention.

FIG. 6A is a block diagram showing the structure of the optical transmitter according to the first embodiment including the IC package, and FIG. 6B is a block diagram showing the structure of an optical receiver according to the first embodiment including the IC package. In FIG. 6A, reference character 61a denotes a connector connected to a logic LSI or the like on a system's side, reference character 62 denotes an LD module having a laser diode, reference character 63 denotes an optical fiber, reference character 64 denotes an optical connector, reference character 65 denotes an EA module which corresponds to the optical module 30 shown in FIG. 4, and reference character 66 denotes an MUX which corresponds to the IC package 20 shown in FIG. 4.

In FIG. 6B, reference character 61b denotes a connector connected to a logic LSI or the like on a system's side, reference character 68 denotes a PD module having a photo diode, and reference character 69 denotes a DEMUX.

In the housing 50 shown in FIG. 4, the connector 61a, the LD module 62, the EA module 65 (optical module 30), the MUX 66 (IC package 20), the circuit board 4 and so on shown in FIG. 6A are accommodated and secured, and the cover 60 shown in FIG. 3 is secured to the housing 50 by screws. The connector 61a, the LD module 62, the EA module 65, the MUX 66, the circuit board 4, and the housing 50 constitute the optical transmitter as a whole.

In operation, a bias signal generated in the optical transmitter as shown in FIG. 6A is input to the LD module 62, and a laser diode (not shown in the figure) disposed in the LD module 62 emits continuous light according to the bias current. This continuous light is coupled into a lens (not shown in the figure) disposed in the LD module 62, and outgoing light from the lens is then coupled into the optical fiber 63. The continuous light is further transmitted to the optical fiber 43a by way of the optical connector 64. Instead of the use of the optical connector 64, ends of the optical fibers 63 and 43a are joined together by fusion-splicing so that they can be directly connected to each other.

As shown in FIG. 4, a lens 44a, which is disposed at an end of the optical fiber 43a, makes the light incident from optical fiber 43a upon the interior of the optical module 30 become parallel light, and the lens 39a held by a lens holder not shown in the figure then focuses the parallel light into a back surface of an EA element (not shown in the figure) disposed in the optical semiconductor element 38. The EA element attenuates the light incident upon the back surface thereof so as to generate modulated light by absorbing a part of the light from the optical fiber 43a according to a voltage signal applied-thereto from the driver 35, and outputting remaining light, which is not absorbed thereby, from a front surface thereof.

Furthermore, a clock signal of a frequency of 2.5 GHz and a 16-channel parallel data signal of 2.5 Gbps input from the connector 61a shown in FIG. 6A are transmitted to conductive pads disposed on a lower surface of the MUX 66 (IC package 20) by way of high-frequency transmission lines formed on the circuit board 4, and are then input to a corresponding bare chip 2 by way of the plurality of bumps 14, the chip carrier 1a, and a plurality of bumps 6 shown in FIG. 2.

A PLL circuit equipped with a VCO, a D-FF circuit, a parallel-serial converter, a timing generator and so on are formed in the bare chip 2 having a function of MUX, and the bare chip 2 transforms the 16-channel parallel data signal of 2.5 Gbps into a 1-channel serial data signal of 40 Gbps in synchronization with the clock signal of a frequency of 2.5 GHz. Furthermore, the PLL circuit transforms the clock signal of 2.5 GHz into a clock signal of 40 GHz.

The 1-channel serial data signal and the clock signal are transmitted to the two differential pairs of lines 11a and 11b of the chip carrier 1a by way of the plurality of bumps 6 and the vias 10a and 10b shown in FIG. 2. As shown in FIGS. 4 and 5, the 1-channel serial data signal and the clock signal are then transmitted from the two differential pairs of lines 11a and 11b to the differential pairs of lines 33a and 33b of the optical module 30 (i.e., the EA module 65 shown in FIG. 6A) by way of the gold wires 51. The data signal is transmitted via the differential pair of lines 33a, and the clock signal is transmitted via the other differential pair of lines 33b.

As shown in FIG. 4, the data signal and the clock signal respectively transmitted via the two differential pairs of lines 33a and 33b are further transmitted to the driver 35, so that the driver 35 performs waveform shaping and amplification on the data signal based on the clock signal and then transmits the waveform-shaped and amplified data signal to the optical semiconductor element 38 as the voltage signal of a high frequency.

The optical semiconductor element 38 shown in FIG. 4 drives and modulates laser light of certain intensity, which is incident thereupon byway of the optical fiber 43a, according to the voltage signal of a high frequency from the driver 35, and then outputs the modulated light by way of its front surface. As an alternative, the optical semiconductor element 38 can drive and modulate the incident laser light according to the voltage signal of a high frequency from the driver 35 so that the modulated light has certain intensity. The outgoing light from the optical semiconductor element 38 is coupled into the optical fiber 43b by way of the lens 39b and another lens 44b disposed at an end of the optical fiber 43b, and the optical signal is then output to outside the housing 50 by way of the optical fiber 43b.

As shown in FIG. 3B, since ends of the two differential pairs of lines 11a and 11b of the IC package 20 and the two differential pairs of lines 33a and 33b disposed in the feedthrough 32 of the optical module 30 are arranged in the same plane, and therefore they are in the same level, the length L3 of line through which high-frequency signals output from the bare chip 2 are transmitted to the optical module 30 can be shortened. In addition, since the gold wires 51 are only one discontinuous point in the connection between the IC package 20 and the optical module 30, the deterioration of the transmission characteristics of high-frequency signals can be reduced.

Next, processes of mounting the IC package 20 on the circuit board 4 and connecting the IC package 20 to the optical module 30 will be explained. In the chip carrier 1a equipped with one or more bare chips 2, a mask board for protecting the two differential pairs of lines 11a and 11b is attached to the groove 16a so as to cover the groove. Next, another mask board is placed on the circuit board 4 on which resists are provided on parts where no solder is needed, and components including the IC package 20 are mounted on the circuit board 4 after cream solder is coated through holes formed in the other mask board.

Then, after placing the circuit board 4 in a reactor so as to melt the cream solder, and providing natural cooling for the circuit board so as to complete the soldering, the circuit board 4 is washed. As a result, the plurality of bumps 14 of the chip carrier 1a are secured to the circuit board 4, and all the components are mounted on the circuit board 4.

Furthermore, the optical module 30 is secured at a predetermined position in the housing 50, and the plurality of leads 42 of the optical module 30 are soldered to corresponding terminals on the circuit board 4. In addition, the two differential pairs of lines 11a and 11b of the IC package 20 are bonded to the two corresponding differential pairs of lines 33a and 33b in the feedthrough 32 of the optical module 30 by way of the gold wires 51, respectively.

In the above-mentioned example, the EA module 65 which uses an EA element as the optical module 30 is explained. As an alternative, an EA-LD module in which a laser diode and an EA element are integrated can be used. In this case, the LD module 62 shown in FIG. 6A becomes unnecessary, and continuous light emitted from the laser diode is incident upon a back surface of the EA element. The EA element attenuates the light incident thereupon from the laser diode by absorbing a part of the light from the laser diode according to the voltage signal applied thereto from the driver 35 shown in FIG. 4, and outputting remaining light which is not absorbed thereby from its front face.

Furthermore, in the case of the optical receiver shown in FIG. 6B the PD module 68 can be used as the optical module 30 and the DEMUX 69 can be used as the IC package 20. In this case, a photo diode (not shown in the figure) mounted on a circuit board within the PD module 68 transforms an optical signal input from the optical fiber 67 into a current signal, and this current signal is input to a preamplifier (not shown in the figure) mounted in the PD module 68, so that the current signal is transformed into a voltage signal. The voltage signal from the preamplifier is then output to the DEMUX 69 through the feedthrough 32 of the PD module 68.

Figure 7:
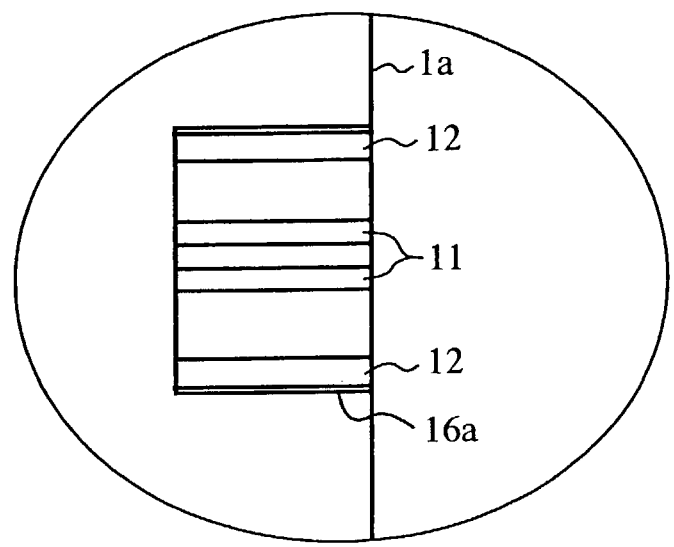
FIG. 7 is a detail view of a differential pair of lines through which a voltage signal of a high frequency is transmitted in the IC package of the optical receiver according to the first embodiment of the present invention.

FIG. 7 is a detail view of a differential pair of lines through which the voltage signal of a high frequency is transmitted in the IC package 20 having a function of the DEMUX 69. The differential pair of lines (conductive lines) 11 through which the voltage signal is transmitted are formed as shown in the figure. The voltage signal of a high frequency of 40 Gbps is output to the IC package 20 (DEMUX 69) by connecting output terminals in the feedthrough 32 of the PD module 68 to the differential pair of lines 11 of the IC package 20.

The DEMUX 69 performs waveform shaping on the voltage signal of a high frequency so as to reproduce a clock signal of 40 GHz and a data signal of 40 Gbps, converts the reproduced data signal into a 16-channel parallel data signal, and converts the clock signal into a clock signal of 2.5 GHz. The DEMUX 69 then transmits the data signal and the clock signal to the circuit board 4 by way of BGA.

Figure 8A:
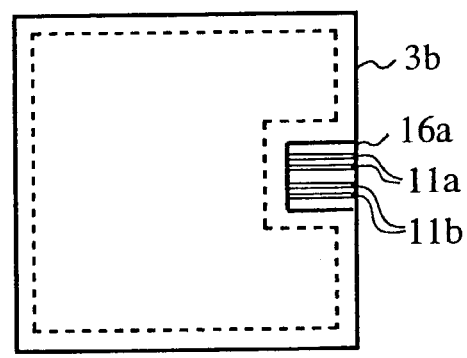
FIGS. 8A and 8B are views showing the structure of an IC package according to a variant of the first embodiment of the present invention.
Figure 8B:
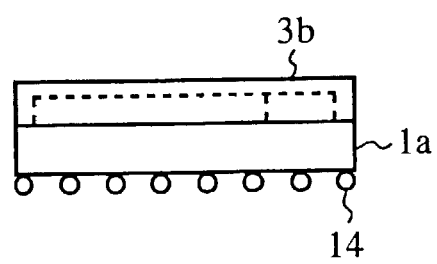

FIG. 8A is a top plan view showing the structure of an IC package according to a variant of the first embodiment, and FIG. 8B is a side view of the IC package. As shown in FIGS. 8A and 8B, a metallic lid 3b is so constructed as to cover an entire upper surface of the chip carrier 1a with a groove 16a being exposed on the upper surface of the chip carrier 1a. A dashed line in FIGS. 8A and 8B shows a margin of the metallic cover 3b secured to the upper surface of the chip carrier, and the mounting efficiency on the chip can be improved in this case because the mounting space within the metallic cover 3b is increased.

Figure 9A:
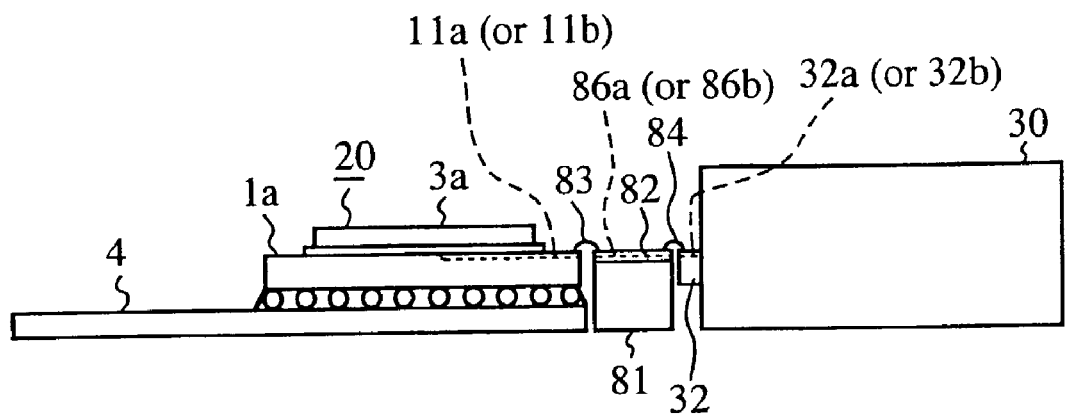
FIGS. 9A and 9B are views showing the structure of an optical transmitter according to a variant of the first embodiment of the present invention.
Figure 9B:
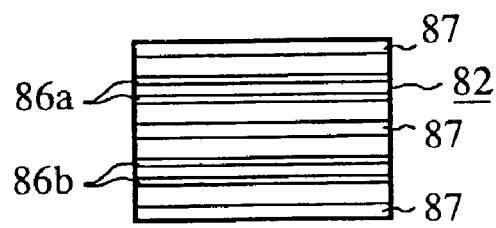

FIGS. 9A and 9B are views showing the structure of an optical transmitter according to a variant of the first embodiment. A circuit board 82 is placed on a metallic mount 81 arranged in the housing 50 of FIG. 4. As shown in FIG. 9B, as long as the deterioration of the transmission characteristics of high-frequency signals does not become a problem, two differential pairs of lines (conductive lines) through which high-frequency signals are transmitted can be formed on the circuit board 82, and the two differential pairs of lines 86a and 86b formed on the circuit board 82 can be connected to the two differential pairs of lines 11a and 11b of the IC package 20 by way of gold wires 83 and the two differential pairs of lines 86a and 86b formed on the circuit board 82 can be connected to the two differential pairs of lines 33a and 33b formed in the feedthrough 32 of the optical module 30 by way of gold wires 84. As shown in FIG. 9B, three grounded conductors 87 are arranged between the two differential pairs of lines 86a and 86b formed on the circuit board 82, and on both outer sides of them, respectively.

Figure 10:
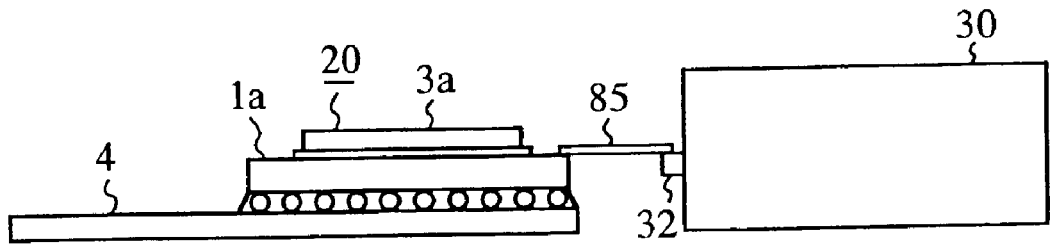
FIG. 10 is a side view showing the structure of an optical transmitter according to another variant of the first embodiment of the present invention.

FIG. 10 is a side view showing the structure of an optical transmitter according to another variant of the first embodiment. As shown in FIG. 10, a flexible circuit board 85 on which two differential pairs of lines (conductive lines) are formed can be used instead of the circuit board 82 shown in FIGS. 9A and 9B. In this case, no wire is needed for the connection between the optical module 30 and the IC package 20. Both ends of a surface of the flexible circuit board 85 on which the two differential pairs of lines are formed are brought into directly contact with the high-frequency pairs of lines of the IC package 20 and the optical module 30 so that the differential pairs of lines are connected to the high-frequency pairs of lines of the IC package 20 and the optical module 30 by way of bumps or the like.

Thus, the connection between the IC package 20 and the optical module 30 using the flexible circuit board 85 and bumps or the like makes it possible to decrease the inductance component as compared with the case of using wires, and to reduce the deterioration of the transmission characteristics of high-frequency signals.

As previously explained, the IC package 20 of the first embodiment is applied to both an optical transmitter and an optical receiver. The IC package 20 of the first embodiment can also be applied to an optical transmitter and receiver.

As mentioned above, in accordance with the first embodiment, two differential pairs of lines 11a and 11b, which are exposed on a chip carrier 1a of an IC package 20, and a feedthrough 32 of an optical module 30 are formed for transmission of high-frequency signals between the IC package 20 and the optical module 30, and BGA consisting of a plurality of bumps 14 of the IC package 20 and a circuit board 4 are disposed for transmission of other signals. Accordingly, the deterioration of the transmission characteristics of high-frequency signals can be reduced, and the IC package 20 can be downsized. Furthermore, the manufacturability of the IC package 20 can be improved by enabling the mounting of the IC package on the circuit board 4 by reflow soldering.

Embodiment 2.

Figure 11A:
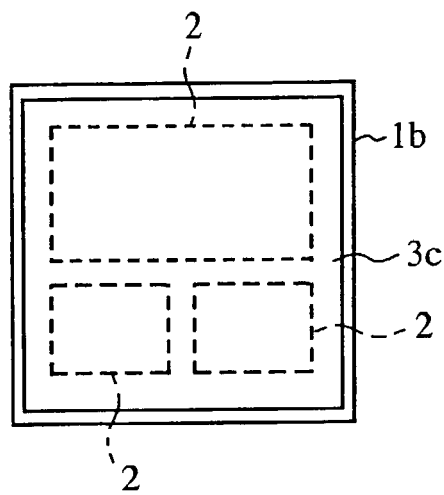
FIGS. 11A to 11D are views showing the structure of an IC package according to a second embodiment of the present invention.
Figure 11C:
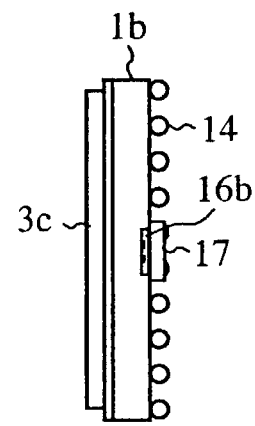
Figure 11B:
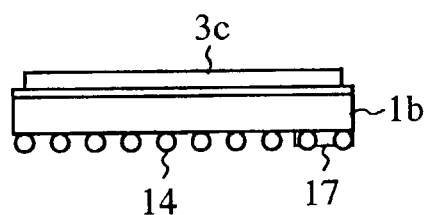
Figure 11D:
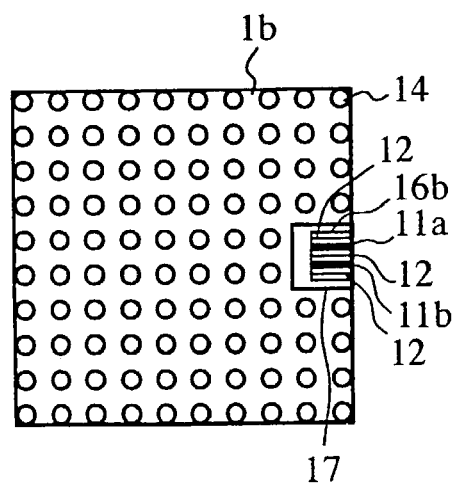

FIGS. 11A to 11D are views showing the structure of an IC package according to a second embodiment of the present invention. FIG. 11A is a top plan view of the IC package, FIGS. 11B and 11C are side views of the IC package, and FIG. 11D is a bottom plan view of the IC package. In FIGS. 11A to 11D, a plurality of bare chips 2 and a plurality of bumps 14 are the same as those of the first embodiment shown in FIGS. 1A to 1E, and therefore the explanation of those components will be omitted hereafter. Reference character 1b denotes a chip carrier which is similar to the chip carrier 1a of the first embodiment shown in FIGS. 1A to 1E, and reference character 3c denotes a metallic lid which is similar to the metallic lid 3a of the first embodiment shown in FIGS. 1A to 1E.

In this embodiment, two differential pair of lines 11a and 11b through which high-frequency signals are transmitted are exposed on a surface of a groove 16b formed in a lower surface (second surface) of the chip carrier 1b. Reference numeral 17 denotes a sidewall projecting from the lower surface of the chip carrier 1b and surrounding the groove 16b formed in the lower surface of the chip carrier 1b so that solder should not flow into the two differential pair of lines 11a and 11b during reflow soldering.

Figure 12A:
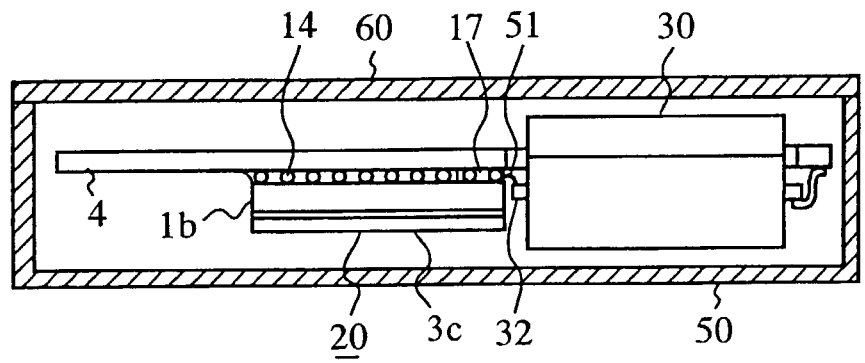
FIGS. 12A to 12C are views showing the structure of an optical transmitter which employs the IC package according to the second embodiment of the present invention.
Figure 12B:
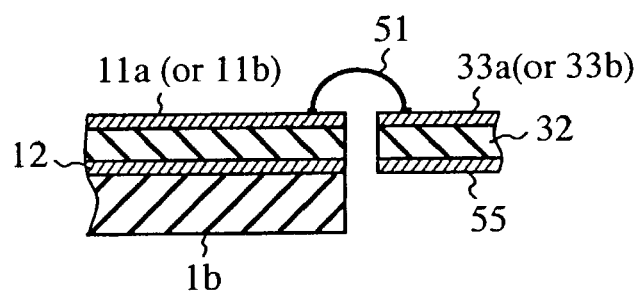
Figure 12C:
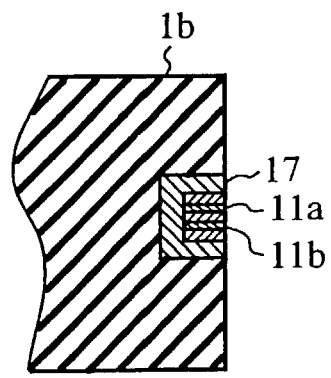

FIGS. 12A to 12C are views showing the structure of an optical transmitter which employs the IC package shown in FIGS. 11A to 11D. FIG. 12B is a partially enlarged cross-sectional view showing the two differential pairs of lines 11a and 11b of the chip carrier 1b, and a feedthrough 32 of an optical module 30, and FIG. 12C is a partially plan view showing the two differential pairs of lines 11a and 11b of the chip carrier 1b.

In FIGS. 12A to 12C, reference numeral 4 denotes a circuit board on which the IC package 20 consisting of the chip carrier 1b, a plurality of bare chips 2, the metallic lid 3c, and a plurality of bumps 14 is mounted, reference numeral 50 denotes a housing of the optical transmitter, reference numeral 51 denotes gold wires for connecting the two differential pairs of lines 11a and 11b to two differential pairs of lines 33a and 33b formed in the feedthrough 32, and reference numeral 60 denotes a cover of the optical transmitter. High-frequency signals are transmitted by way of the feedthrough 32 disposed in the optical module 30. Gold ribbons for connecting the two differential pairs of lines 11a and 11b of the IC package to the two differential pairs of lines 33a and 33b formed in the feedthrough 32 by bonding can be used instead of the gold wires 51.

As shown in FIGS. 11A to 11D, in the IC package of this embodiment, the exposed end portions of the two differential pairs of lines 11a and 11b through which high-frequency signals are output from the IC package are substantially flush with the plurality of bumps 14 forming BGA. Thus, the output terminals of the IC package, through which high-frequency signals are output, can be disposed on either of the upper and lower surfaces of the chip carrier depending on the concept of manufacturing the optical transmitter. The IC package 20 of FIGS. 11A to 11D is mounted on a lower surface of the circuit board 4 so that the two differential pairs of lines 11a and 11b are flush with the feedthrough 32 of the optical module 30, as shown in FIGS. 12A to 12C. Furthermore, since the metallic lid 3c of the IC package 20 is secured to a lower surface (first surface) of the chip carrier 1b so that the metallic lid 3c and the groove 16b are placed on opposite sides of the chip carrier, as shown in FIGS. 11A to 11D, the metallic lid 3c of the IC package 20 can be enlarged as compared with the metallic lid 3a of the above-mentioned first embodiment, and therefore the mounting space for the plurality of bare chips 2 on the upper surface of the chip carrier 1b can be increased.

Furthermore, as long as upsizing of the IC package is not caused and the manufacturability of the IC package does not deteriorate, another package structure such as QFP can be adopted as a method of delivering high-frequency signals from the IC package 20.

As previously explained, the IC package 20 of the second embodiment is applied to an optical transmitter. The IC package 20 of the second embodiment can also be applied to an optical receiver and an optical transmitter and receiver.

As mentioned above, in accordance with the second embodiment, two differential pairs of lines 11a and 11b, which are exposed on a chip carrier 1b of an IC package 20, and a feedthrough 32 of an optical module 30 are formed for transmission of high-frequency signals between the IC package 20 and the optical module 30, and BGA consisting of a plurality of bumps 14 of the IC package 20 and a circuit board 4 are disposed for transmission of other signals. Accordingly, the deterioration of the transmission characteristics of high-frequency signals can be reduced, and the IC package 20 can be downsized. Furthermore, the manufacturability of the IC package 20 can be improved by enabling the mounting of the IC package on the circuit board 4 by reflow soldering.

Many widely different embodiments of the present invention may be constructed without departing from the spirit and scope of the present invention. It should be understood that the present invention is not limited to the specific embodiments described in the specification, except as defined in the appended claims.

What is claimed is:

1. An optical transmitter comprising:
   an IC package including a chip carrier, a bare chip mounted on a first surface of said chip carrier, a plurality of first bumps for connecting a plurality of chip electrodes disposed on said bare chip to a plurality of first conductive pads disposed on the first surface of said chip carrier, respectively, said plurality of first conductive pads being classified into first and second groups, a plurality of vias for connecting a plurality of second conductive pads disposed on a second surface of said chip carrier opposite to the first surface to said first conductive pads of said first group, respectively, a plurality of second bumps connected to said second conductive pads, respectively, and at least a conductive line formed with said chip carrier and connected to one of said first conductive pads of said second group;
   an optical module having a feedthrough in which a conductive line through which a high-frequency signal is transmitted is formed, for transmitting an optical signal; and
   a first circuit board to which said IC package is secured by way of said plurality of second bumps of said IC package, a high-frequency signal from said bare chip of said IC package to said optical module being transmitted by way of said conductive line formed with said chip carrier and said conductive line formed in said feedthrough, and signals other than the high-frequency signal being input into said bare chip of said IC package by way of said plurality of second bumps.

2. The optical transmitter according to claim 1, wherein said conductive line exposed on the surface of said chip carrier is connected to said conductive line formed in said feedthrough by wire bonding or ribbon bonding.

3. The optical transmitter according to claim 1, wherein said conductive line exposed on the surface of said chip carrier is connected to said conductive line formed in said feedthrough by way of a second circuit board on which a conductor line is formed.

4. The optical transmitter according to claim 1, wherein said conductive line exposed on the surface of said chip carrier is connected to said conductive line formed in said feedthrough by way of a flexible circuit board on which a conductor line is formed.

5. The optical transmitter according to claim 1, wherein said conductive line exposed on the surface of said chip carrier and said conductive line formed in said feedthrough are arranged in a same plane.

6. An optical receiver comprising:
   an IC package including a chip carrier, a bare chip mounted on a first surface of said chip carrier, a plurality of first bumps for connecting a plurality of chip electrodes disposed on said bare chip to a plurality of first conductive pads disposed on the first surface of said chip carrier, respectively, said plurality of first conductive pads being classified into first and second groups, a plurality of vias for connecting a plurality of second conductive pads disposed on a second surface of said chip carrier opposite to the first surface to said first conductive pads of said first group, respectively, a plurality of second bumps connected to said second conductive pads, respectively, and at least a conductive line formed with said chip carrier and connected to one of said first conductive pads of said second group;
   an optical module having a feedthrough in which a conductive line through which a high-frequency signal is transmitted is formed, for receiving an optical signal; and
   a first circuit board to which said IC package is secured by way of said plurality of second bumps of said IC package, a high-frequency signal from said optical module to said bare chip of said IC package being transmitted by way of said conductive line formed in said feedthrough and said conductive line formed with said chip carrier, and signals other than the high-frequency signal output from said bare chip of said IC package being transmitted by way of said first circuit board and said plurality of second bumps.

7. The optical receiver according to claim 6, wherein said conductive line exposed on the surface of said chip carrier is connected to said conductive line formed in said feedthrough by wire bonding or ribbon bonding.

8. The optical receiver according to claim 6, wherein said conductive line exposed on the surface of said chip carrier is connected to said conductive line formed in said feedthrough by way of a second circuit board on which a conductor line is formed.

9. The optical receiver according to claim 6, wherein said conductive line exposed on the surface of said chip carrier is connected to said conductive line formed in said feedthrough by way of a flexible circuit board on which a conductor line is formed.

10. The optical receiver according to claim 6, wherein said conductive line exposed on the surface of said chip carrier and said conductive line formed in said feedthrough are arranged in a same plane.

11. An optical communication device comprising:
    an IC package including a chip carrier, a bare chip mounted on a first surface of said chip carrier, a plurality of first bumps for connecting a plurality of chip electrodes disposed on said bare chip to a plurality of first conductive pads disposed on the first surface of said chip carrier, respectively, said plurality of first conductive pads being classified into first and second groups, a plurality of vias for connecting a plurality of second conductive pads disposed on a second surface of said chip carrier opposite to the first surface to said first conductive pads of said first group, respectively, a plurality of second bumps connected to said second conductive pads, respectively, and at least a conductive line formed with said chip carrier and connected to one of said first conductive pads of said second group;
    an optical module having a feedthrough in which a conductive line through which a high-frequency signal is communicated is formed; and
    a first circuit board to which said IC package is secured by way of said plurality of second bumps of said IC package, a high-frequency signal communicated between said bare chip of said IC package and said optical module being communicated by way of said conductive line formed with said chip carrier and said conductive line formed in said feedthrough, and signals other than the high-frequency signal communicated between said bare chip of said IC package and said optical module being communicated by way of said plurality of second bumps.

12. The optical communication device according to claim 11, wherein the optical communication device comprises an optical receiver, the optical receiver comprising the IC package, the optical module and the first circuit board.

13. The optical communication device according to claim 11, wherein the optical communication device comprises an optical transmitter, the optical transmitter comprising the IC package, the optical module and the first circuit board.

14. The optical communication device according to claim 11, wherein said conductive line exposed on the surface of said chip carrier is connected to said conductive line formed in said feedthrough by wire bonding or ribbon bonding.

15. The optical communication device according to claim 11, wherein said conductive line exposed on the surface of said chip carrier is connected to said conductive line formed in said feedthrough by way of a second circuit board on which a conductor line is formed.

16. The optical communication device according to claim 11, wherein said conductive line exposed on the surface of said chip carrier is connected to said conductive line formed in said feedthrough by way of a flexible circuit board on which a conductor line is formed.

17. The optical communication device according to claim 11, wherein said conductive line exposed on the surface of said chip carrier and said conductive line formed in said feedthrough are arranged in a same plane.

18. The optical transmitter according to claim 1, wherein the bare chip comprises a multiplexer.

19. The optical receiver according to claim 6, wherein the bare chip comprises a demultiplexer.

20. The optical communication device according to claim 11, wherein said conductive line is exposed on the surface of the chip carrier.

* * * * *